United States Patent
Jung et al.

(10) Patent No.: US 7,381,519 B2
(45) Date of Patent: Jun. 3, 2008

(54) TOP ANTI-REFLECTIVE COATING POLYMER, ITS PREPARATION METHOD AND TOP ANTI-REFLECTIVE COATING COMPOSITION COMPRISING THE SAME

(75) Inventors: Jae Chang Jung, Seoul (KR); Cheol Kyu Bok, Icheon-Shi (KR); Chang Moon Lim, Icheon-Shi (KR); Seung Chan Moon, Yongin-Si (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 407 days.

(21) Appl. No.: 11/158,965

(22) Filed: Jun. 22, 2005

(65) Prior Publication Data

US 2006/0127803 A1    Jun. 15, 2006

(30) Foreign Application Priority Data

Dec. 15, 2004  (KR) .................. 10-2004-0106673

(51) Int. Cl.
G03F 7/38  (2006.01)
G03F 7/30  (2006.01)
G03F 7/11  (2006.01)
G03F 7/095 (2006.01)

(52) U.S. Cl. ............. 430/311; 525/276; 525/243; 525/259; 430/326; 430/273.1

(58) Field of Classification Search ............... None
See application file for complete search history.

(56) References Cited

U.S. PATENT DOCUMENTS

| | | | |
|---|---|---|---|
| 5,879,853 A | 3/1999 | Azuma | |
| 6,057,080 A | 5/2000 | Brunsvold et al. | |
| 6,274,295 B1 | 8/2001 | Dammel et al. | |
| 2003/0108815 A1* | 6/2003 | Jung et al. | 430/273.1 |
| 2003/0219682 A1 | 11/2003 | Wakiya et al. | |
| 2006/0127804 A1* | 6/2006 | Jung et al. | 430/270.1 |
| 2006/0273070 A1* | 12/2006 | Jung | 216/41 |
| 2006/0275695 A1* | 12/2006 | Jung et al. | 430/270.1 |

FOREIGN PATENT DOCUMENTS

| | | |
|---|---|---|
| JP | 09-050129 | 2/1997 |
| JP | 10-319601 | 12/1998 |
| JP | 2003-122012 | 4/2003 |
| JP | 2003-202673 | 7/2003 |
| KR | 20010003934 | 1/2001 |

OTHER PUBLICATIONS

Kanto Corporation Material Safety Data Sheet, PGMEA, Date of Preparation Feb. 2004, 4 pages.*
MPCA Glossary, Minnesota Pollution Control Agency, http://www.pca.state.mn.us/gloss/glossary.cfm?alpha=P&header=1&glossaryCat=1, 3 pages prined from web on Jan. 31, 2008.*
STN Database search in Registry file for PGMEA, run Jan. 31, 2008, 6 pages , from STN Columbus.*

* cited by examiner

*Primary Examiner*—Cynthia Hamilton
(74) *Attorney, Agent, or Firm*—Marshall, Gerstein & Borun LLP

(57) ABSTRACT

Disclosed herein is a top anti-reflective coating polymer and its composition comprising the same represented by Formula 1 below:

(1)

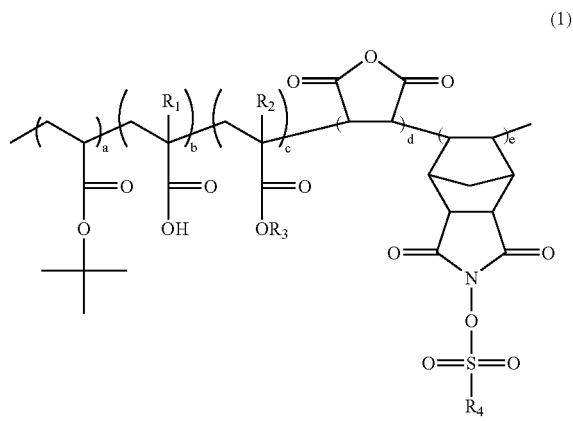

wherein $R_1$ and $R_2$ are independently, hydrogen, methyl or fluoromethyl; $R_3$ and $R_4$ are independently, a $C_{1-10}$ hydrocarbon or a $C_{1-10}$ hydrocarbon in which the hydrogen atoms are wholly or partly replaced by fluorine atoms; and a, b, c, d and e represent the mole fraction of each monomer and are in the range between about 0.05 and about 0.9, such that the sum of a, b, c, d, and e equals one.

22 Claims, 2 Drawing Sheets

\<Run Conditions\>
System: T60+External RI
Solvent: THF
Columns: G2500Hhl+G4000Hhl
Inj: Vol.: 100.0uL
Concentration: 0.000 mg/mL
Flow Rate: 1.000 mL/min
Analyst: Dong Chul Seo \<GPC Data Summary\>
Mn: 10,400   Pd: 2.33
Mw: 24,200
Mz: 63,000
% Below1,000:   0.0
% Above 20,000:   44.8

TOP ANTI-REFLECTIVE COATING POLYMER, ITS PREPARATION METHOD AND TOP ANTI-REFLECTIVE COATING COMPOSITION COMPRISING THE SAME

BACKGROUND

1. Technical Field

The disclosure relates to an anti-reflective coating polymer used in photolithography, which is one of the fabrication processes for a semiconductor device, a method for preparing the anti-reflective coating polymer, and an anti-reflective coating composition comprising the anti-reflective coating polymer. More specifically, the disclosure relates to a top anti-reflective coating polymer usable in immersion lithography for the fabrication of sub-50 nm semiconductor devices, a method for preparing the top anti-reflective coating polymer, and a top anti-reflective coating composition comprising the top anti-reflective coating polymer.

2. Description of the Related Art

Photolithography is a process used in the transfer of a semiconductor circuit pattern formed on a photomask to a wafer, and is one of the most important processes in determining the fineness and integration density of circuits in the fabrication of semiconductor devices.

In recent years as the integration density of semiconductor devices has increased, new techniques have been developed that are adapted to the fine processing required in the fabrication of semiconductor devices. There is an increasing need for a fine processing technique in a photolithography process. As the circuit line widths are becoming finer and finer, the use of short-wavelength light sources for illumination and high numerical aperture lenses is required. Non-limiting examples of such short wavelength light sources are EUV, F2, ArF and KrF excimer lasers, listed in decreasing order of preference.

A number of studies on the development of sub-50 nm devices have been undertaken. Recent attention has been directed toward the development of suitable processing equipment and materials associated with the use of F2 and EUV as exposure light sources. Several issues arise from the use of EUV and F2 lasers as light sources. Technical solutions for the use of F2 are satisfactory to some extent. However, high-quality $CaF_2$ is difficult to produce on an industrial scale within a short time. Also, since soft pellicles are likely to be deformed upon exposure to light at 157 nm, the lifetime of the light source is short. Hard pellicles incur considerable production costs, and are difficult to produce on a commercial scale due to the nature of light refraction. EUV lasers have their own drawbacks. Suitable light sources, exposure equipment and masks are required for EUV laser use, making their application impractical. Accordingly, the formation of finer high-precision photoresist patterns by using a photoresist adapted to the use of an ArF excimer laser is of importance.

Dry lithography is an exposure system wherein air is filled between an exposure lens and a wafer. In contrast to dry lithography, immersion lithography, which corresponds to an NA scaling technique, is an exposure system wherein water is filled between an exposure lens and a wafer. Since water (with a refractive index (n) of=1.4) is used as the medium for a light source in the immersion lithography, the NA is 1.4 times larger than that of dry lithography using air (refractive index (n)=1.0). Accordingly, immersion lithography is advantageous in terms of its high resolution.

A problem encountered with the fabrication of a sub-50 nm semiconductor device is that alteration of the critical dimension (CD) of a photoresist pattern inevitably occurs during the process for the formation of this ultrafine pattern. These alterations arise from standing waves, reflective notching, and diffracted and reflected light from an underlying layer due to the optical properties of the underlying layer on an overlying photoresist and due to the variation in the thickness of the photoresist. To prevent light from reflecting off the underlying layer, an anti-reflective coating is introduced between the photoresist and the underlying layer. The anti-reflective coating is composed of a material that absorbs light in the range of wavelengths used by the exposure light source. Previous treatments have placed this anti-reflective coating on the bottom, interposed between the underlying layer and the photoresist. With the recent increase in the fineness of photoresist patterns, a top anti-reflective coating (TARC) has also been developed in order to prevent the photoresist pattern from being disrupted by the reflected and diffracted light. Specifically, as remarkable miniaturization of semiconductor devices makes photoresist patterns extremely fine, the use of a bottom anti-reflective coating alone cannot completely prevent the patterns from being disrupted by scattered reflection. Accordingly, a top anti-reflective coating is introduced to prevent the disruption of the patters.

However, since conventional top anti-reflective coatings for use in dry lithography are water-soluble, they cannot be applied to immersion lithography. In other words, since water is used as a medium for a light source in immersion lithography, it easily dissolves the conventional top anti-reflective coatings. Accordingly, there is need for the development of a top anti-reflective coating for use in immersion lithography that is compatible with immersion lithography. This new top anti-reflective coating must satisfy the following requirements. The top anti-reflective coating must be transparent to a light source and have a refractive index between 1.5 and 1.65, depending on the kind of an underlying photosensitive film (i.e., photoresist) to be used. When the top anti-reflective coating composition is coated on an underlying photosensitive film, it must not dissolve the photosensitive film. The top anti-reflective coating must not be soluble in water upon light exposure, but must be soluble in a developing solution. Finally, the top anti-reflective coating must enable the formation of a vertical pattern for creation of the photoresist.

The above-mentioned stringent requirements make the development of a suitable top anti-reflective coating for use in immersion lithography difficult. One of the sources of this difficulty arises from the conventional top anti-reflective coatings inability to allow for the desired formation of a photoresist pattern. Thus, there exists a strong need for the development of atop anti-reflective coating for use in immersion lithography which is water-insoluble and enables the formation of a vertical pattern upon formation of a semiconductor pattern.

SUMMARY OF THE DISCLOSURE

In view of the above problems a top anti-reflective coating polymer is disclosed which is suitable for use in immersion lithography due to its water insolubility, which can prevent the multiple interference of light inside a photoresist in the formation of a photoresist paten and can inhibit the alteration in the dimensions of the photoresist pattern resulting from the variation in the thickness of the photoresist.

A method for preparing the top anti-reflective coating polymer, a top anti-reflective coating composition comprising the top antireflective coating polymer, and a method for forming a pattern by using the top anti-reflective coating composition are also disclosed.

A disclosed top anti-reflective coating polymer is represented by Formula 1 below:

Formula 1

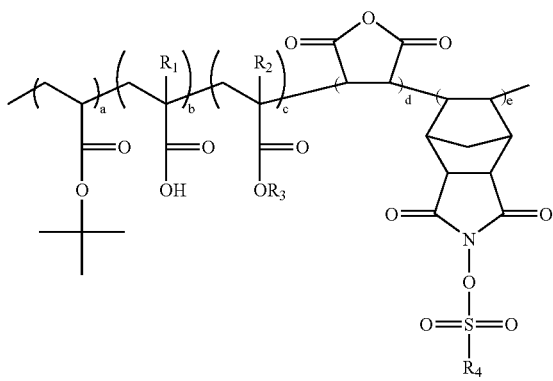

wherein $R_1$ and $R_2$ are independently hydrogen, methyl or fluoromethyl; $R_3$ and $R_4$ are independently a $C_{1-10}$hydrocarbon or a $C_{1-10}$ hydrocarbon in which the hydrogen atoms are wholly or partly replace by fluorine atoms; and a, b, c, d and e represent the mole fraction of each monomer and are in the range between about 0.05 and about 0.9, such that the sum of a, b, c, d, and equals one.

A disclosed method for preparing a poly(t-butylacrylate-methacrylic acid-2,2,3,4,4,4-hexafluorobutylacrylate-N-[(perfluoroalkanesulfonyl)oxy]-norbornene-2,3-dicarboximide-maleic anhydride), comprises:

(1) dissolving an N-[(perfluoroalkanesulfonyl)oxy]-norbornene-2,3-dicarboximide monomer, a maleic anhydride monomer and a polymerization initiator in an organic solvent, and subjecting the monomers to free-radical polymerization; and (2) adding a solution of a t-butylacrylate monomer, a methacrylic acid monomer and a 2,2,3,4,4,4-hexafluorobutyl acrylate monomer in an organic solvent to the polymerization product obtained in step 1, and subjecting the mixture to free-radical polymerization.

A disclosed top anti-reflective coating composition comprises a top anti-reflective coating polymer represented by Formula 1 below:

(1)

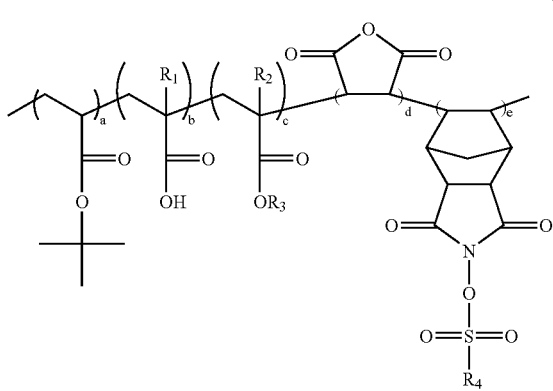

wherein $R_1$ and $R_2$ are independently hydrogen, methyl or fluoromethyl; $R_3$ and $R_4$ are independently a $C_{1-10}$hydrocarbon or a $C_{1-10}$ hydrocarbon in which the hydrogen atoms are wholly or partly replaced by fluorine atoms; and a, b, c, d and e represent the mole fraction of each monomer and are in the range between about 0.05 and about 0.9, such that the sum of a, b, c, d, and e equals one.

A disclosed method for forming a pattern of a semiconductor device comprises: (a) applying a photoresist to a semiconductor substrate on which a particular underlying structure is formed; (b) applying the top anti-reflective coating composition on top of the photoresist to form a top anti-reflective coating; (c) exposing the photoresist to light, and (d) developing the photoresist to form a photoresist pattern.

DETAILED DESCRIPTION OF THE PRESENTLY PREFERRED EMBODIMENTS

Figure 1:
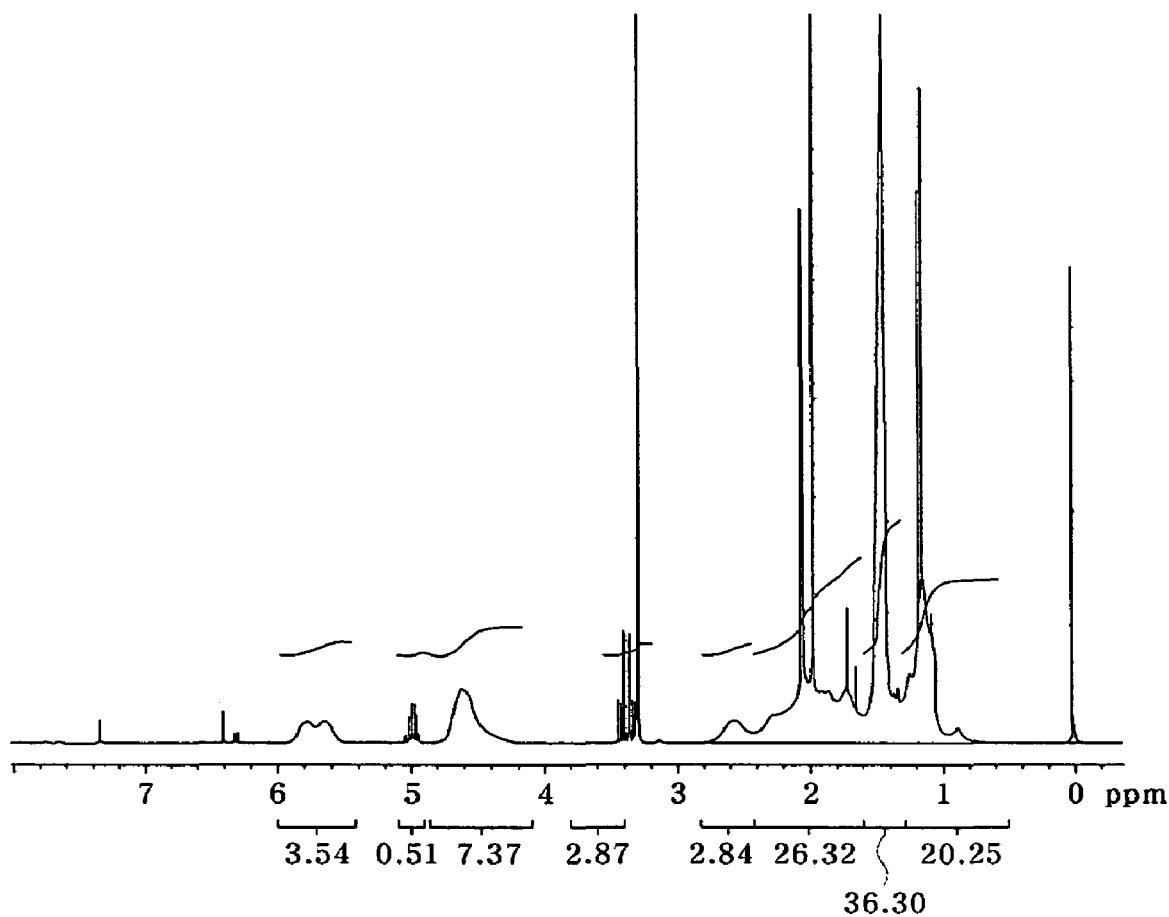
FIG. 1 is a $^1$H-NMR spectrum of a top anti-reflective coating polymer prepared in Example 1 of the disclosure.

The disclosure provides a top anti-reflective coating polymer represented by Formula 1 below:

(1)

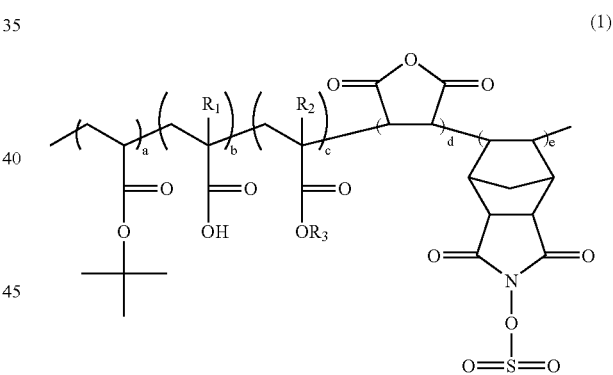

wherein $R_1$ and $R_2$ are independently hydrogen, methyl or fluoromethyl; $R_3$ and $R_4$ are independently a $C_{1-10}$hydrocarbon or a $C_{1-10}$ hydrocarbon in which the hydrogen atoms are wholly or partly replaced by fluorine atoms; and a, b, c, d and e represent the mole fraction of each monomer and are in the range between about 0.05 and about 0.9, such that the sum of a, b, c, d, and e equals one.

The top anti-reflective coating polymer of Formula 1 exhibits high light transmission, and thus is suited to formation of a top anti-reflective coating. In addition, since the top anti-reflective coating polymer is highly soluble in a developing solution after light exposure it has no effect on the formation of a photoresist pattern. Furthermore, since the top anti-reflective coating polymer is water-insoluble, it is suitable for use in immersion lithography. Moreover, since the top anti-reflective coating polymer can prevent scattered reflection from the top of a photoresist, it can effectively prevent a photoresist pattern from being disrupted by scattered reflection.

Further, the polymer of Formula 1 according to the disclosure contains a constituent monomer unit capable of acting as a photoacid generator, i.e., N-[(perfluoroalkanesulfonyl)oxy]-norbornene-2,3-dicarboximide. The introduction of the monomer unit acting as a photoacid generator into the polymer acting as a top anti-reflective coating polymer enables dissolution in an immersion solution, thus preventing lens contamination. That is, since the polymer of Formula 1 is not water-soluble and can perform the roles of both a top anti-reflective coating polymer and a photoacid generator, it can be used to prepare a top anti-reflective coating composition for immersion lithography. Furthermore, when a top anti-reflective coating composition comprising the polymer in Formula 1 according to the disclosure is used to form a pattern, it dissolves a portion of a photoacid generator present at the top of an underlying photosensitizer, thus preventing the top from being formed into a thick section.

Considering the physical properties, including solubility and reflective index, of an anti-reflective coating to be coated on top of the photoresist, the top anti-reflective coating polymer of the present invention has a weight average molecular weight of about 1,000 to about 1,000,000, and preferably about 1,000 to about 100,000. Too high a molecular weight causes a decrease in the solubility in a developing solution. As a result, a portion of the anti-reflective coating remains on the photoresist even after development, causing pattern contamination. On the other hand, too low a molecular weight cannot ensure optimized reflective index of the anti-reflective coating and suitable 'overcoating' on the photoresist.

Examples of the top anti-reflective coating polymer used in the disclosure include, without any limitation, polymers having the structure represented by Formula 1. Of these polymers, preferred is a poly(t-butylacrylate-methacrylic acid-2,2,3,4,4,4-hexafluorobutyl acrylate-N -[(perfluoroalkanesulfonyl)oxy]-norbornene-2,3-dicarboximide-maleic anhydride) represented by Formula 2 below:

Formula 2

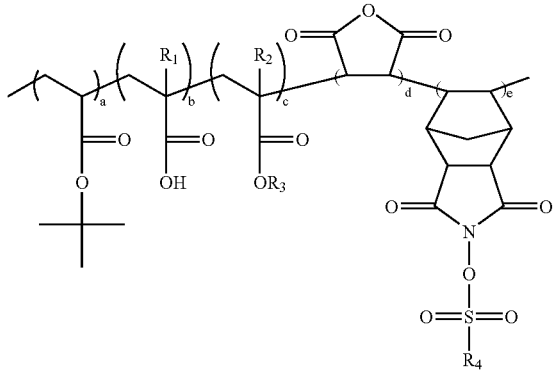

wherein $R_1$ is methyl, $R_2$ is hydrogen, $R_3$ is 2,2,3,4,4,4-hexafluorobutyl, $R_4$ is a perfluoroalkane, and a, b, c, d and e represent the mole fraction of each monomer and are in the range between about 0.05 and about 0.9, such that the sum of a, b, c, d, and e equals one.

Poly(t-butylacrylate-methacrylic acid-2,2,3,4,4,4-hexafluorobutyl acrylate-N -[(perfluorooctanesulfonyl)oxy]-norbornene-2,3-dicarboximide-maleic anhydride) is particularly preferred.

The disclosure also provides a method for preparing a poly(t-butylacrylate-methacrylic acid-2,2,3,4,4,4-hexafluorobutyl acrylate-N-[(perfluoroalkanesulfonyl)oxy]-norbornene-2,3-dicarboximide-maleic anhydride) comprising the steps of: dissolving an N-[(perfluoroalkanesulfonyl)oxy]-norbornene-2,3-dicarboximide monomer, a maleic anhydride monomer and a polymerization initiator in an organic solvent, and subjecting the monomers to free-radical polymerization (step 1); then adding a solution of a t-butylacrylate monomer, a methacrylic acid monomer and a 2,2,3,4,4,4-hexafluorobutyl acrylate monomer in an organic solvent to the polymerization product obtained in step 1, and subjecting the mix to free-radical polymerization (step 2).

The polymerization of step 1 is preferably carried out at about 57 to about 77° C. for about 10 to about 50 minutes, while that of step 2 is preferably carried out for about 2 to about 10 hours.

Examples of organic solvents that can be used in the polymerization of steps 1 and 2 include common organic solvents for free-radical polymerization. Preferably, the organic solvent used in the method of the disclosure is selected from the group consisting of acetone, propylene glycol methyl ether acetate (PGMEA), tetrahydrofuran, cyclohexanone, dimethylformamide, dimethylsulfoxide, dioxane, methyl ethyl ketone, ethylacetate, benzene, toluene, and xylene. Acetone is most preferred.

Further, the polymerization initiator used in step 1 is preferably selected from the group consisting of 2,2'-azobisisobutyronitrile (AIBN), benzoylperoxide, acetylperoxide, laurylperoxide, t-butylperacetate, t-butylhydroperoxide and di-t-butylperoxide. The use of 2,2'-azobisisobutyronitrile (AIBN) is most preferred.

The disclosure also provides a top anti-reflective coating composition comprising a top anti-reflective coating polymer represented by Formula 1 below:

(1)

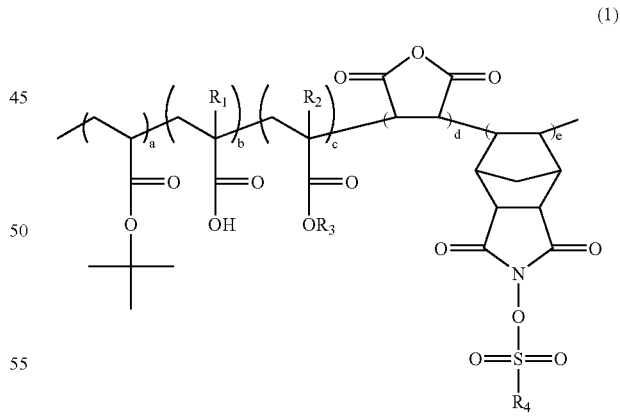

wherein $R_1$ and $R_2$ are independently hydrogen, methyl or fluoromethyl; $R_3$ and $R_4$ are independently a $C_{1-10}$ hydrocarbon or a $C_{1-10}$ hydrocarbon in which the hydrogen atoms are wholly or partly replaced by fluorine atoms; and a, b, c, d and e represent the mole fraction of each monomer and are in the range between about 0.05 and about 0.9, such that the sun of a, b, c, d, and e equals one.

Organic solvents usable in the top anti-reflective coating composition of the disclosure are not specially limited so long as they can dissolve the top anti-reflective coating polymer. Primary alcohols, such as n-butanol, n-pentanol, n-hexanol, n-heptanol and n-octanol, are particularly preferred because they do not dissolve most underlying photosensitizers, preventing mixing between the top anti-reflective coating composition and an underlying photosensitizer when the composition is coated on the photosensitizer. A particularly preferred primary alcohol that can be used in the top anti-reflective coating composition is n-butanol.

Considering the thickness of the anti-reflective coating, the organic solvent is preferably used in an amount of about 1,000 to about 10,000 wt %, based on the weight of the top anti-reflective coating polymer. If the amount of n-butanol is outside this range, the thickness of the anti-reflective coating cannot be optimized.

The top anti-reflective coating composition of the disclosure may further comprise an acid diffusion inhibitor. The acid diffusion inhibitor is not specially limited so long as it can inhibit diffusion of an acid. L-proline is particularly preferred. The top anti-reflective coating composition of the disclosure may comprise about 1 to about 20 wt % of the acid diffusion inhibitor, based on the weight of the top anti-reflective coating polymer. The acid diffusion inhibitor contained in the top anti-reflective coating composition acts to further inhibit the diffusion of an acid toward the unexposed region.

The top anti-reflective coating composition has an optimal reflective index of about 1.4 to about 2.0. Accordingly, when the top anti-reflective coating composition is overcoated on top of a photoresist, the reflectance can be mire and thus the photoresist pattern can be protected from being disrupted by reflected light.

The disclosure also provides a method for forming a pattern of a semiconductor device comprising the steps of (a) applying a photoresist to a semiconductor substrate on which a particular underlying structure is formed; (b) applying the top anti-reflective coating composition on top of the photoresist to form a top anti-reflective coating; (c) exposing the photoresist to light, and (d) developing the photoresist to form a photoresist pattern.

The pattern formation method according to the disclosure is characterized in that the anti-reflective coating formed on top of the photoresist is formed using the top anti-reflective coating composition of the disclosure. Since the top anti-reflective coating thus formed has a reflective index of about 1.4 to about 2.0, the reflectance at the top of the photoresist can be minimized. Accordingly, the photoresist pattern formed by the method of the disclosure has greatly improved pattern uniformity.

According to the pattern formation method of the disclosure, baking may be carried out before and/or after light exposure. The baking is preferably carried out at about 70° C. to about 200° C.

The anti-reflective coating composition and the pattern formation method of the disclosure are mainly applied to a process for forming an ultrafine pattern using an ArF light source (193 nm). Likewise, they can be applied to a process for forming an ultrafine pattern using a light source (e.g., F2 or EUV) having a shorter wavelength, so long as water can be used as the medium for the light source. The light exposure using the light source is preferably achieved with an exposure energy of about 0.1 to about 50 mJ/cm$^2$.

In the pattern formation method of the disclosure, the development can be carried out using an alkaline developing solution. As a particularly preferred alkaline developing solution, a about 0.01 to about 5% (w/w) solution of tetramethylammoniumhydroxide (TMAH) in water is used.

The disclosure also provides the use of the top anti-reflective coating composition in the fabrication of a semiconductor device. Since the top anti-reflective coating composition of the disclosure can minimize scattered reflection, it can be applied to various processes for fabricating semiconductor devices, in addition to the formation process of an ultrafine pattern.

It can be appreciated that the top anti-reflective coating composition of the disclosure can be applied to a variety of processes in ways obvious to those skilled in the art, depending on the type of the processes.

The disclosure will now be described in more detail with reference to the following examples. However, these examples are given for the purpose of illustration and are not to be construed as limiting the scope of the invention.

EXAMPLES

Example 1

Preparation of a top anti-reflective coating polymer: poly(t-butylacrylate-methacrylic acid-2,2,3,4,4,4-hexafluorobutyl acrylate-N-[(perfluorooctanesulfonyl)oxy]-norbornene-2,3-dicarboximide-maleic anhydride)

Figure 2:
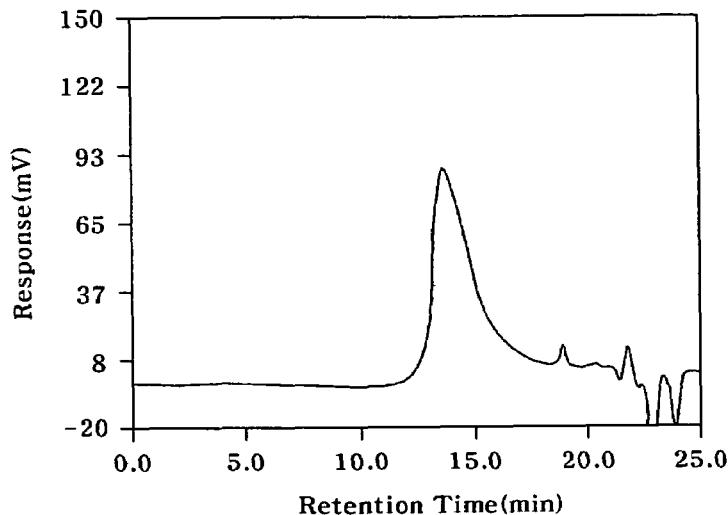
FIG. 2 shows GPC data and chromatogram of a top anti-reflective coating polymer prepared in Example 1 of the disclosure.

0.5 g of N-[(perfluorooctanesulfonyl)oxy]-norbornene-2,3-dicarboximide, 0.5 g of maleic anhydride and 0.4 g of AIBN were dissolved in 10 g of acetone. The monomers were polymerized at 67° C. for 30 minutes. To the polymerization product were added a solution of 2.5 g of t-butylacrylate, 2.5 g of methacrylic acid and 5 g of 2,2,3,4,4,4-hexafluorobutyl acrylate in 40 g of acetone. The mixture was polymerized for 6 hours. After completion of the polymerization, the polymerization product was precipitated in water, filtered, and dried in a vacuum to give poly(t-butylacrylate-methacrylic acid-2,2,3,4,4,4-hexafluorobutyl acrylate-N-[(perfluorooctanesulfonyl)oxy]-norbornene-2,3-dicarboximide-maleic anhydride) in a yield of 68%. The structure of the polymer was identified by $^1$H-NMR spectroscopy (FIG. 1), and the GPC data and chromatogram of the polymer are shown in FIG. 2.

Example 2

Preparation of a Top Anti-Reflective Coating Composition and Pattern Formation 1.0 g of the poly(t-butylacrylate-methacrylic acid-2,2,3,4,4,4-hexafluorobutyl acrylate-N-[(perfluorooctanesulfonyl)oxy]-norbornene-2,3-dicarboximide-maleic anhydride) prepared in Example 1 was dissolved in 60 g of n-butanol to create a top anti-reflective coating composition for immersion lithography.

Figure 3:
FIG. 3 is an 80 nm-L/S image of a semiconductor pattern formed using a top anti-reflective coating composition prepared in Example 2 of the disclosure.

A photosensitizer (AR1221J, JSR) was coated to a thickness of 200 nm on a wafer, and baked at 130° C. for 90 seconds. The top anti-reflective coating composition was coated at 3,000 rpm on the coated photosensitizer. To confirm whether the top anti-reflective coating composition of the disclosure can function as a protective film of the photosensitizer against water after the coating, the wafer was immersed in water for 3 minutes. After exposing the wafer to light using ArF exposure equipment, the exposed wafer was baked at 130° C. for 90 seconds and developed to form a pattern. An image of the pattern is shown in FIG. 3. The image indicates that the pattern formed using the top anti-reflective coating was vertically formed.

As apparent from the above description, since the top anti-reflective coating polymer of the disclosure exhibits high light on and is water-insoluble, it is suited to the formation of a top anti-reflective coating for use in immersion lithography.

In addition, since the polymer contains a constituent monomer unit capable of acting as a photoacid generator, i.e., N-[(perfluoroalkanesulfonyl)oxy]-norbornene-2,3-dicarboximide, it can perform roles as not only a top anti-reflective coating polymer and but also a photoacid generator. Accordingly, when the top anti-reflective coating composition comprising the top anti-reflective coating polymer of the disclosure is used to form a pattern, it dissolves a portion of a photoacid generator present at the top of an underlying photosensitizer, thus preventing the top from being formed into a thick section.

Furthermore, the top anti-reflective coating formed using the anti-reflective coating composition of the disclosure satisfies the requirements for effective use in immersion lithography. The top anti-reflective coating is transparent to a light source because it has a light transmission of 96% or higher. It has a refractive index between 1.4 and 2.0 and does not dissolve the underlying photosensitizer. The top anti-reflective coating is not soluble in water upon light exposure, but is highly soluble in a developing solution. And, finally, the top anti-reflective coating enables the formation of a vertical pattern. Therefore, since the top anti-reflective coating composition of the disclosure enables the formation of a fine photoresist pattern, it contributes to the fabrication of sub-50 nm semiconductor devices in an efficient manner.

Although the preferred embodiments of the disclosure have been disclosed for illustrative purposes, those skilled in the art will appreciate that various modifications, additions and substitutions are possible, without departing from the scope and spirit of the invention as disclosed in the accompanying claims.

What is Claimed is:

1. A top anti-reflective coating polymer represented by Formula 1 below:

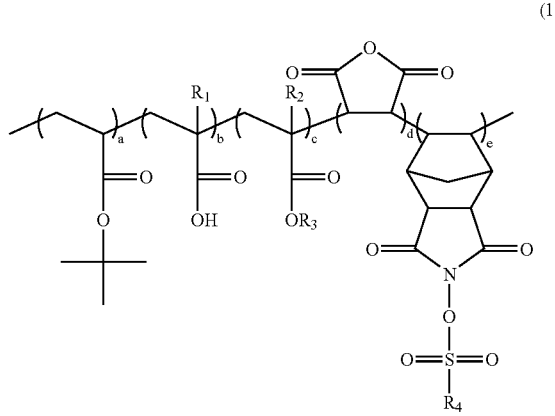

(1)

wherein $R_1$ and $R_2$ are independently hydrogen, methyl or fluoromethyl; $R_3$ and $R_4$ are independently a $C_{1-10}$ hydrocarbon or a $C_{1-10}$ hydrocarbon in which the hydrogen atoms are wholly or partly replaced by fluorine atoms; and a, b, c, d and e represent the mole fraction of each monomer and are in the range between about 0.05 and about 0.9, such that the sum of a, b, c, d, and e equals one.

2. The polymer according to claim 1, wherein the polymer has a weight average molecular weight of about 1,000 to about 100,000.

3. The polymer according to claim 1, wherein the polymer is a poly(t-butylacrylate-methacrylic acid-2,2,3,4,4,4-hexafluorobutylacrylate-N-[(perfluoroalkanesulfonyl)oxy]-norbornene-2,3-dicarboximide-maleic anhydride) represented by Formula 2 below:

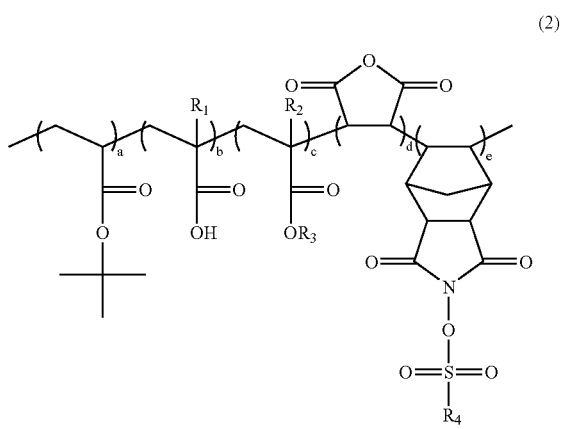

(2)

wherein $R_1$ is methyl, $R_2$ is hydrogen, $R_3$ is 2,2,3,4,4,4-hexafluorobutyl, $R_4$ is a perfluoroalkane, and a, b, c, d and e represent the mole fraction of each monomer and are in the range between about 0.05 and about 0.9, such that the sum of a, b, c, d, and e equals one.

4. A method for preparing the top anti-reflective coating polymer according to claim 3, comprising:

(a) dissolving an N-[(perfluoroalkanesulfonyl)oxy]-norbornene-2,3-dicarboximide monomer, a maleic anhydride monomer and a polymerization initiator in an organic solvent, and subjecting the monomers to free-radical polymerization; and (b) adding a solution of a t-butylacrylate monomer, a methacrylic acid monomer and a 2,2,3,4,4,4-hexafluorobutyl acrylate monomer in an organic solvent to the polymerization product obtained in (a), and subjecting the mixture to free-radical polymerization.

5. The method according to claim 4, wherein the polymerization of (a) is carried out at about 57° C. to about 77° C.

6. The method according to claim 4, wherein the polymerization of (a) is carried out for about 10 minutes to about 50 minutes.

7. The method according to claim 4, wherein the polymerization of (a) is carried out for about 2 hours to about 10 hours.

8. The method according to claim 4, wherein the organic solvent used in the polymerization of (a) and (b) is at least one solvent selected from the group consisting of acetone, propylene glycol methyl ether acetate (PGMEA), tetrahydrofuran, cyclohexanone, dimethylformamide, dimethylsulfoxide, dioxane, methyl ethyl ketone, ethylacetate, benzene, toluene, and xylene.

9. The method according to claim 4, wherein the polymerization initiator used in (a) is selected from the group consisting of 2,2'-azobisisobutyronitrile (AIBN), benzoylperoxide, acetylperoxide, laurylperoxide, t-butylperacetate, t-butylhydroperoxide, and di-t-butylperoxide.

10. The polymer according to claim 1, wherein the polymer is poly(t-butylacrylate-methacrylic acid-2,2,3,4,4,4-hexafluo robutyl acrylate-N-[(perfluorooctanesulfonyl)oxy]-norbornene-2,3-dicarboximide-maleic anhydride).

11. A top anti-reflective coating composition, comprising:
a top anti-reflective coating polymer represented by Formula 1 below:

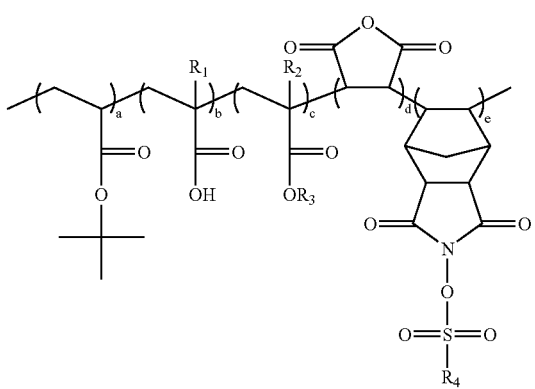

(1)

wherein $R_1$ and $R_2$ are independently hydrogen, methyl or fluoromethyl; $R_3$ and $R_4$ are independently a $C_{1-10}$ hydrocarbon or a $C_{1-10}$ hydrocarbon in which the hydrogen atoms are wholly or partly replaced by fluorine atoms; and a, b, c, d and e represent the mole fraction of each monomer and are in the range between about 0.05 and about 0.9, such that the sum of a, b, c, d, and e equals one; and
an organic solvent.

12. The composition according to claim 11, wherein the organic solvent is a primary alcohol.

13. The composition according to claim 12, wherein the primary alcohol is n-butanol.

14. The composition according to claim 11, wherein the composition is prepared by dissolving the top anti-reflective coating polymer in about 1,000 to about 10,000 wt % of the organic solvent, based on the weight of the polymer.

15. The composition according to claim 11, further comprising an acid diffusion inhibitor.

16. The composition according to claim 15, wherein the acid diffusion inhibitor is L-proline.

17. The composition according to claim 15, wherein the composition comprises about 1 to about 20 wt % of the acid diffusion inhibitor, based on the weight of the top anti-reflective coating polymer.

18. The composition according to claim 11, wherein the composition has a refractive index between about 1.4 and about 2.0.

19. A method for forming a pattern of a semiconductor device, comprising:
(a) applying a photoresist to a semiconductor substrate on which an underlying structure is formed;
(b) applying the top anti-reflective coating composition according to claim 11 on top of the photoresist to form a top anti-reflective coating;
(c) exposing the photoresist to light, and
(d) developing the photoresist to form a photoresist pattern.

20. The method according to claim 19, comprising baking before and/or after light exposure.

21. The method according to claim 20, comprising baking at about 70° C. to about 200° C.

22. The method according to claim 19, comprising carrying out the developing using about 0.01 to about 5% (w/w) solution of tetramethylammoniumhydroxide (TMAH) in water as a developing solution.

* * * * *